(12) United States Patent
Kinoshita et al.

(10) Patent No.: US 11,269,382 B2
(45) Date of Patent: Mar. 8, 2022

(54) ELECTRONIC APPARATUS

(71) Applicant: LENOVO (SINGAPORE) PTE. LTD., Singapore (SG)

(72) Inventors: Hiroaki Kinoshita, Kanagawa (JP); Masaaki Bandoh, Kanagawa (JP); Sara Akiyama, Kanagawa (JP); Tabito Miyamoto, Kanagawa (JP); Satoshi Hosoya, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 42 days.

(21) Appl. No.: 16/894,609

(22) Filed: Jun. 5, 2020

(65) Prior Publication Data

US 2020/0387199 A1 Dec. 10, 2020

(30) Foreign Application Priority Data

Jun. 7, 2019 (JP) .............................. JP2019-107137

(51) Int. Cl.
*G06F 1/16* (2006.01)
*H05K 5/03* (2006.01)
*E05B 65/00* (2006.01)

(52) U.S. Cl.
CPC .......... *G06F 1/1679* (2013.01); *E05B 65/006* (2013.01); *G06F 1/1616* (2013.01); *H05K 5/03* (2013.01); *G06F 2200/163* (2013.01)

(58) Field of Classification Search
CPC .... G06F 1/1613; G06F 1/1615; G06F 1/1616; G06F 1/1633; G06F 1/1656; G06F 1/1679; H05K 5/0004; H05K 5/0047
See application file for complete search history.

(56) References Cited

U.S. PATENT DOCUMENTS

| 9,606,575 | B2* | 3/2017 | Gerst | G06F 1/1601 |
| 2007/0165369 | A1* | 7/2007 | Hong | G06F 1/1637 361/679.05 |
| 2011/0314644 | A1* | 12/2011 | Wei | F16B 21/073 24/343 |
| 2013/0002111 | A1* | 1/2013 | Liu | G06F 1/1656 312/257.1 |
| 2015/0288403 | A1* | 10/2015 | Shikanai | G06F 1/1656 455/566 |
| 2015/0338887 | A1* | 11/2015 | Farahani | G06F 1/166 345/170 |

FOREIGN PATENT DOCUMENTS

| JP | 56042426 | 4/1981 |
| JP | 11225406 A | 8/1999 |
| JP | 2011-080534 A | 4/2011 |
| JP | 2017045853 A | 3/2017 |

\* cited by examiner

*Primary Examiner* — Anthony Q Edwards (74) *Attorney, Agent, or Firm* — Antony P. Ng; Russell Ng PLLC (57) ABSTRACT

An electronic apparatus is disclosed. The electronic apparatus includes a first chassis member, a second chassis member detachably connected to the first chassis member, a hook, which is supported in a floatable manner with respect to the first chassis member, protrudes from an inner surface of the first chassis member, and an engagement hole, which is provided on an inner surface of the second chassis member, is engageable with the hook.

19 Claims, 7 Drawing Sheets

ELECTRONIC APPARATUS

PRIORITY CLAIM

The present application claims benefit of priority under 35 U.S.C. §§ 120, 365 to the previously filed Japanese Patent Application No. JP2019-107137 with a priority date of Jun. 7, 2019, which is incorporated by reference herein.

TECHNICAL FIELD

The present invention relates to electronic apparatuses in general, and in particular to an electronic apparatus having a first and second chassis members.

BACKGROUND

A chassis of an electronic apparatus, such as a laptop personal computer (laptop PC) or a tablet personal computer (tablet PC), is typically formed into the shape of a flat box by stacking and connecting two chassis members.

In one configuration, the chassis members are each connected by screws or engaging parts provided along each outer peripheral edge part. This configuration prevents the screw from being conspicuous shown on the bottom surface of the chassis members in order to maintain the quality of appearance.

Meanwhile, electronic apparatuses are rapidly becoming thinner, and the plate thickness of the chassis member is also made thinner. Thus, for electronic apparatuses having chassis members connected only at the outer peripheral edge parts, it is likely that, for go example, a central part of the chassis member constituting the bottom surface swells downward of the chassis member. In case of such a deformation, there is a concern that the central part of the bottom surface of the chassis member can be rubbed against a desk or other surfaces to cause a scratch.

There is also a concern that if the chassis member swells, a gap is formed between an inner surface of the chassis member and electronic components inside the chassis and a foreign object can be caught in this gap. However, it is not preferable that the central part of the chassis member is fastened with a screw because of the problem of appearance quality. On the other hand, since the influence of manufacturing tolerance or manufacturing error of each component is accumulated in the central part of the chassis member, it is sometimes difficult to achieve reliable engagement by a general engaging part. Of course, there is concern that such positional deviation in the engaging part in connecting also occurs at locations other than the central part of the chassis member, such as at the outer peripheral edge part.

Consequently, it would be desirable to provide an electronic apparatus having smoothly connecting chassis members without affecting the quality of appearance.

SUMMARY

In accordance with an embodiment of the present disclosure, an electronic apparatus includes a first chassis member, a second chassis member detachably connected to the first chassis member, a hook, which is supported in a floatable manner with respect to the first chassis member, protrudes from an inner surface of the first chassis member, and an engagement hole, which is provided on an inner surface of the second chassis member, is engageable with the hook.

With this configuration, the hook is smoothly engaged with the engagement hole while being centered with respect to the engagement hole by floating operation, when the chassis members are connected to each other. Thus, the electronic apparatus chassis is that even if the hook or the engagement hole is positionally deviated from a desired design position due to influence of manufacturing tolerance or manufacturing error, or assembly error of each chassis member, both can be smoothly engaged. Since a connecting unit with these hook and engagement hole can be appropriately disposed at various positions including the central part and the outer peripheral edge part of the electronic apparatus chassis to minimize the number of installed connecting units with a screw, the quality of appearance will not be affected.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
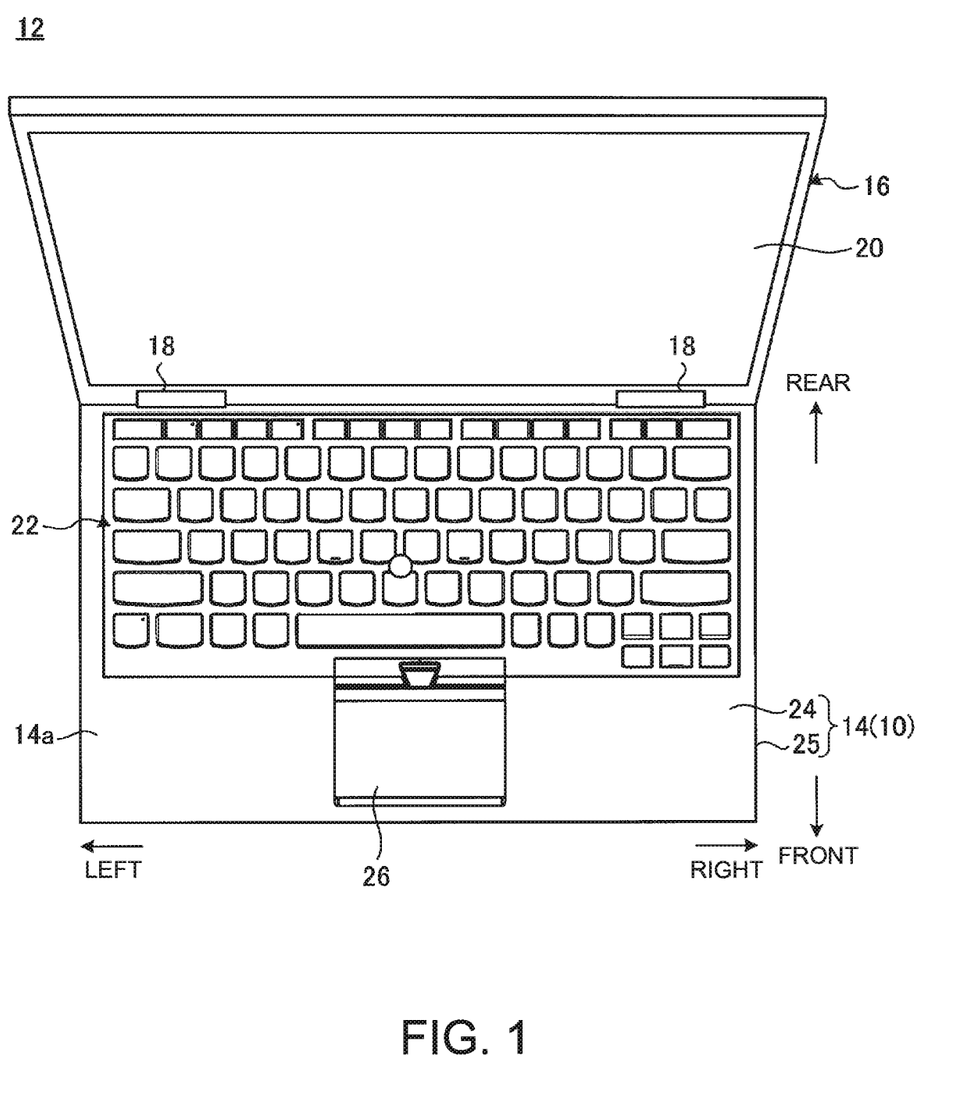
FIG. 1 is a plan view of an electronic apparatus, according to one embodiment.

FIG. 1 is a plan view of an electronic apparatus 12 having an electronic apparatus chassis 10, according to one embodiment. The present embodiment illustrates by way of an example configuration in which the electronic apparatus chassis 10 is used for a main body chassis 14 of the electronic apparatus 12, which is a laptop PC. The electronic apparatus chassis 10 may be used for a display chassis 16. The electronic apparatus 12 may be a desktop PC, a tablet PC, or a smart phone, etc.

FIG. 1 illustrates a state (a usage form) in which the display chassis 16 is opened from the main body chassis 14 by hinges 18. In the following description, based on the usage form illustrated in FIG. 1, the direction toward a user operating a keyboard device 22 while viewing a display 20 is referred to as front, the direction away from the user is referred to as rear, the thickness direction of the main body chassis 14 is referred to as top and bottom, and the width direction of the main body chassis 14 is referred to as left and right.

The display chassis 16 is rotatably connected to a rear edge part of the main body chassis 14 through the hinges 18. The display 20 is a liquid crystal display, for example.

The main body chassis 14 is composed of the electronic apparatus chassis 10 according to the present embodiment. The main body chassis 14 has a structure in which rectangular top cover 24 and bottom cover 25 are vertically stacked and connected to each other and is formed in a flat box shape. The keyboard device 22 is an input operation unit exposed from openings formed in the top cover 24 on a top surface 14a of the main body chassis 14. An input operation unit, such as a touch pad device 26, is also provided in front of the keyboard device 22 on the top surface 14a of the main body chassis 14. Various electronic components, such as a board 27 mounted with an arithmetic processing unit and a memory not illustrated, and a battery device 28, are stored inside the main body chassis 14 (refer to FIG. 3A).

Figure 2:
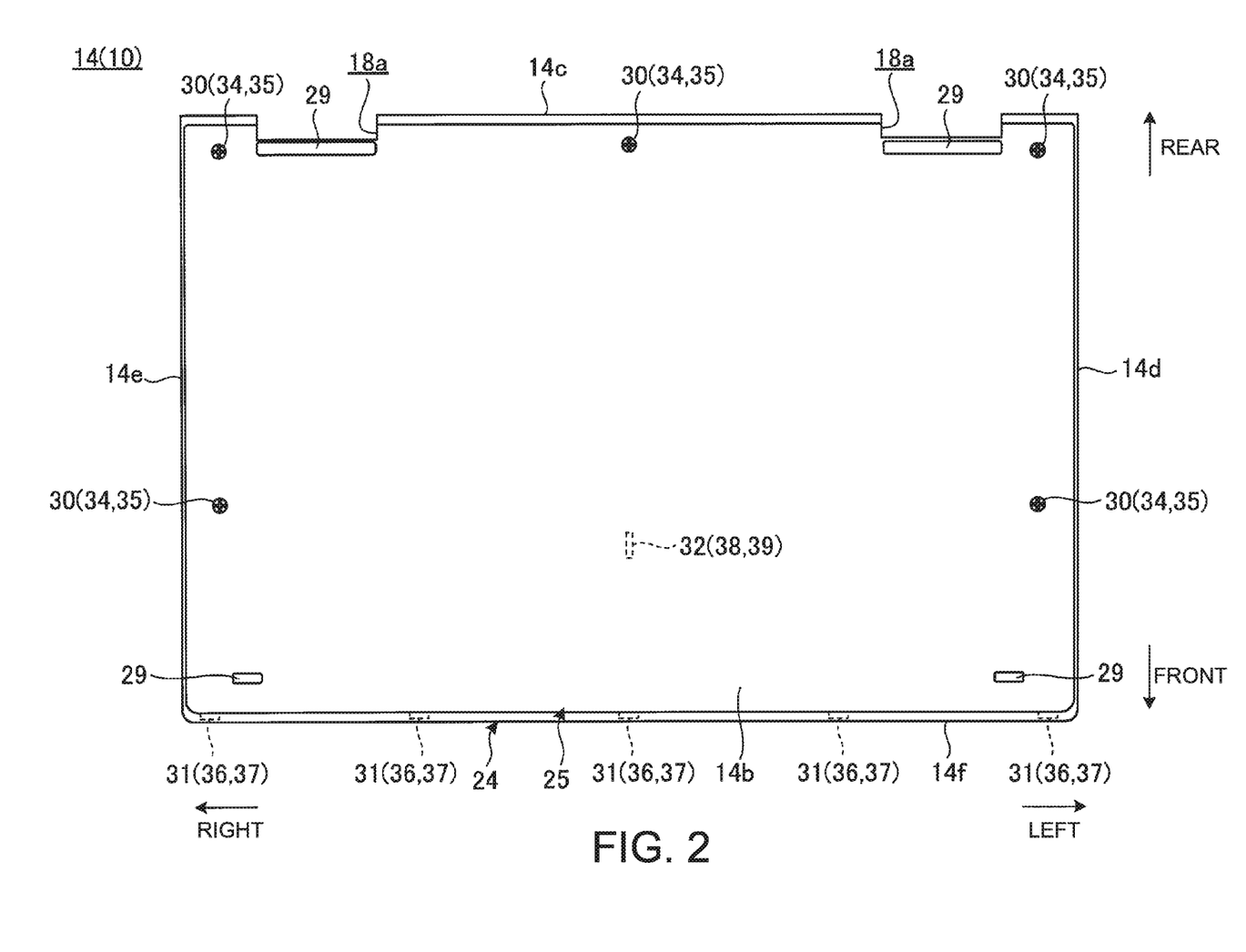
FIG. 2 is a bottom view of a main body chassis.
Figure 3A:
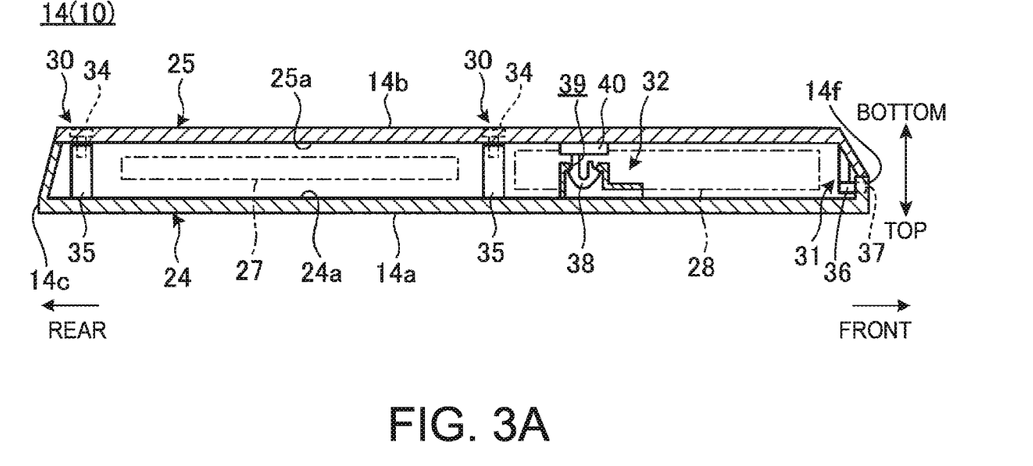
FIG. 3A is a side sectional view illustrating an internal structure of the main body chassis from FIG. 2.
Figure 3B:
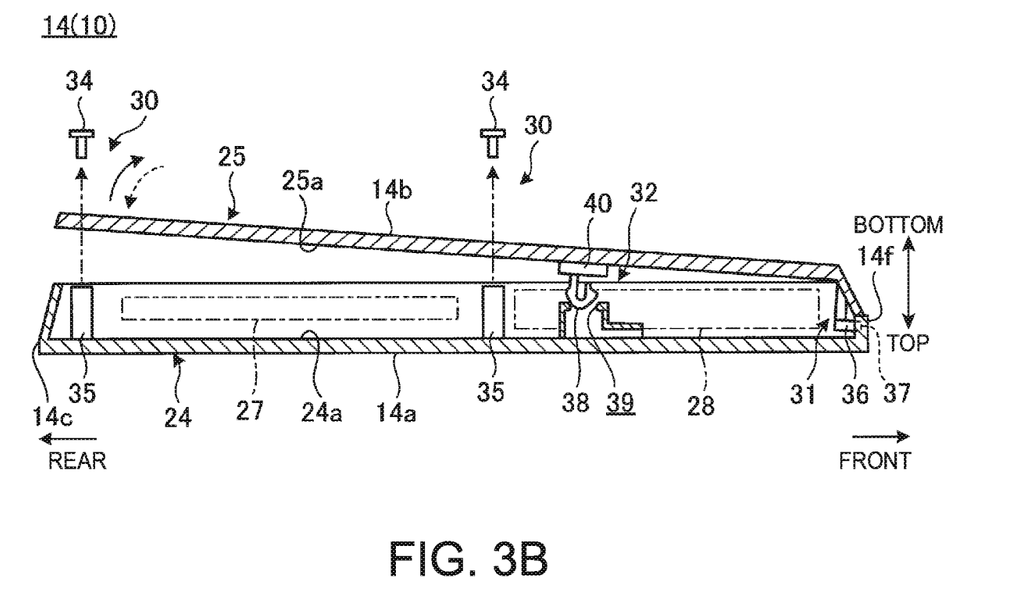
FIG. 3B is a side sectional view illustrating operation of detaching a bottom cover illustrated in FIG. 3A from a top cover.

Next, the configuration of the main body chassis 14 to which the electronic apparatus chassis 10 according to the present embodiment is applied, is specifically described. FIG. 2 is a bottom view of the main body chassis 14. FIG. 3A is a side sectional view schematically illustrating an internal structure of the main body chassis 14. FIG. 3B is a side sectional view illustrating the operation of detaching the bottom cover 25 illustrated in FIG. 3A from the top cover 24. FIG. 3A and FIG. 3B illustrate the main body chassis 14 upside down.

As illustrated in FIG. 2 to FIG. 3B, the top cover 24 is a plate-like chassis member forming a part of four peripheral side surfaces and the top surface 14a of the main body chassis 14. The bottom cover 25 is a plate-like chassis member forming another part of the four peripheral side surfaces and the bottom surface 14b of the main body chassis 14. The top cover 24 and the bottom cover 25 are made of a metallic material, such as magnesium or aluminum, a resin material, such as ABS resin or glass fiber reinforced plastic, or a carbon material, such as carbon fiber reinforced plastic etc. The shape and material of the top cover 24 and the bottom cover 25 can be changed accordingly. The reference symbol 18a in FIG. 2 is notch parts in which chassis parts of the hinges 18 are installed. The reference symbol 29 in FIG. 2 is rubber feet.

The main body chassis 14 of the present embodiment is that the top cover 24 and the bottom cover 25 are connected by three types of connecting units 30, 31, and 32.

The connecting unit 30 is a screw fastening unit composed of a screw 34, and a boss part 35 having a female screw hole into which the screw 34 is threadable. The connecting units 30 are installed at positions close to a rear edge part 14c and left and right side edge parts 14d and 14e of the main body chassis 14, for example. The connecting units 30 of the present embodiment are provided at five positions. Specifically, the connecting units 30 are present at three positions side by side along the rear edge part 14c and at each one position a little closer to the front than the centers of the left and right side edge parts 14d and 14e. The screw 34 is threadably mounted on the boss part 35 from the bottom surface 14b side of the bottom cover 25 through a not illustrated fastening hole formed in the bottom cover 25. Accordingly, the screw 34 fastens the bottom cover 25 and the top cover 24. The number and the positions of the connecting units 30 to be installed can be changed accordingly. However, the connecting unit 30 is preferably used only at positions close to four peripheral edge parts of the main body chassis 14 as illustrated in FIG. 2 in order to prevent the screw 34 from being conspicuous in the bottom surface 14b.

The connecting unit 31 is an engaging unit composed of a protruding piece 36 and an insertion hole 37 into which the protruding piece 36 is insertable. The connecting units 31 are installed at positions close to a front edge part 14f of the main body chassis 14, for example. The connecting units 31 of the present embodiment are installed at five positions side by side along the front edge part 14f. The protruding piece 36 is a plate piece protruding from a front wall part of the bottom cover 25 toward the front. The insertion hole 37 is a rectangular hole formed in a front wall part of the top cover 24 and opened to the rear. When the protruding piece 36 is inserted into the insertion hole 37, it becomes unmovable at least in the top and bottom and right and left directions. Accordingly, the top cover 24 and the bottom cover 25 are connected to each other in a state to be relatively unmovable at least in the top and bottom and right and left directions. The number and the positions of the connecting units 31 to be installed can be changed accordingly. However, although the connecting unit 31 may be that the protruding piece 36 is a little inclined in the top and bottom direction, it is basically necessary to move the protruding piece 36 in a horizontal direction (front and rear direction) to be inserted into the insertion hole 37. Thus, it is preferable that each connecting unit 31 is provided in the same edge part (the front edge part 14f in the present embodiment), of the four peripheral edge parts 14c to 14f of the main body chassis 14. The connecting unit 31 may be configured such that the protruding piece 36 is provided in the top cover 24 and the insertion hole 37 is provided in the bottom cover 25.

The connecting unit 32 is an engaging unit composed of a hook 38 and an engagement hole 39 engageable with the hook 38. The connecting unit 32 is provided at a position a little closer to the front than the central part of the main body chassis 14, for example. The hook 38 is provided on an inner surface 25a side of the bottom cover 25. The engagement hole 39 is provided on an inner surface 24a side of the top cover 24. The number and the positions of the connecting units 32 to be installed can be changed accordingly. The connecting unit 32 may be used other than in the central part of the main body chassis 14, for example, in the outer peripheral edge part.

Figure 4A:
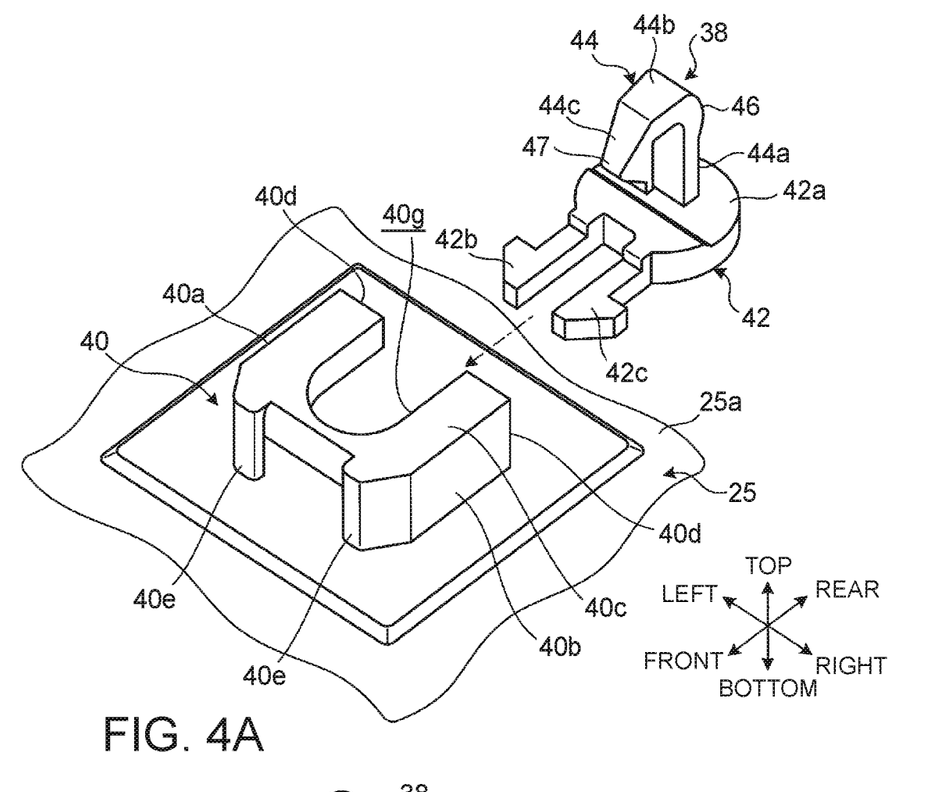
FIG. 4A is an exploded perspective view illustrating operation of attaching a hook to the bottom cover.
Figure 4B:
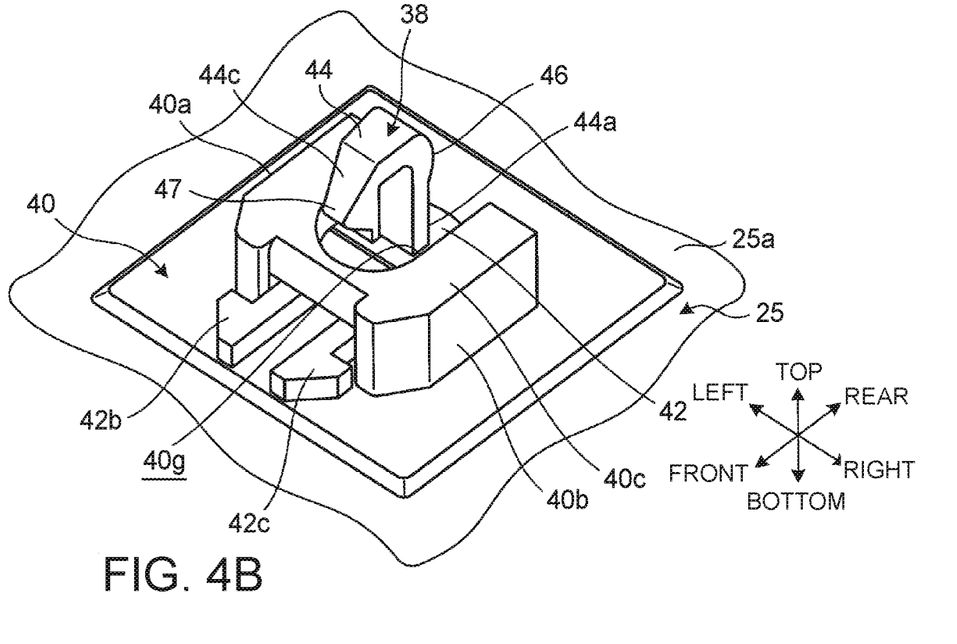
FIG. 4B is a perspective view illustrating a state in which the hook is attached to the bottom cover.
Figure 5A:
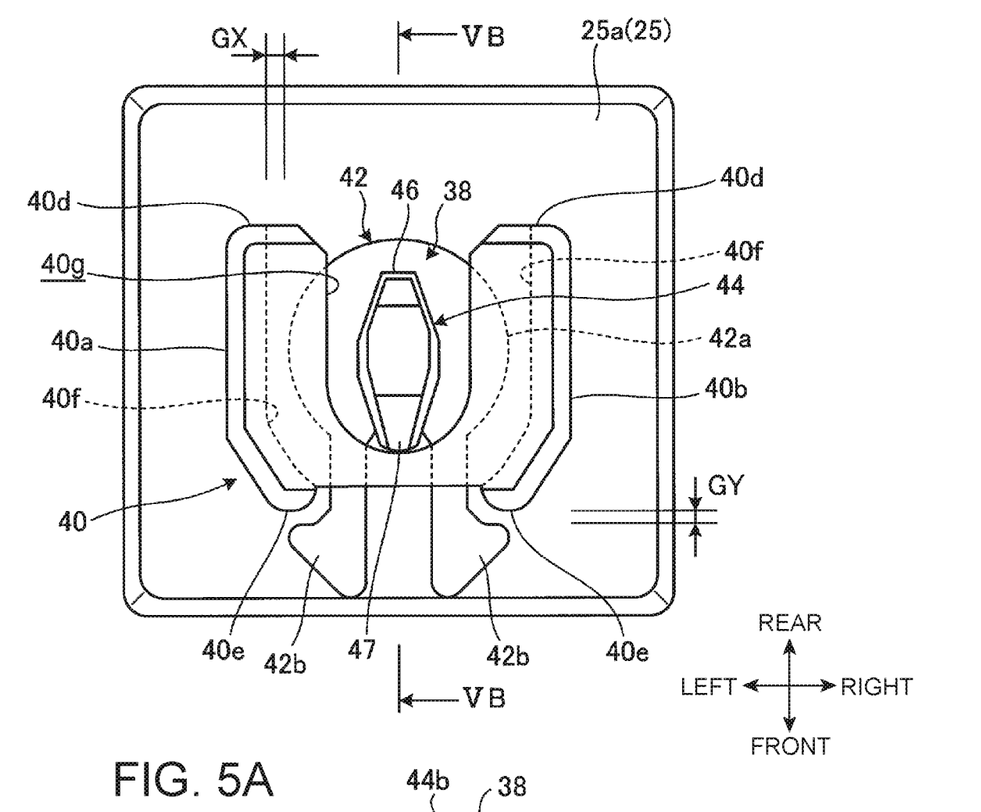
FIG. 5A is a plan view of the hook illustrated in FIG. 4B.
Figure 5B:
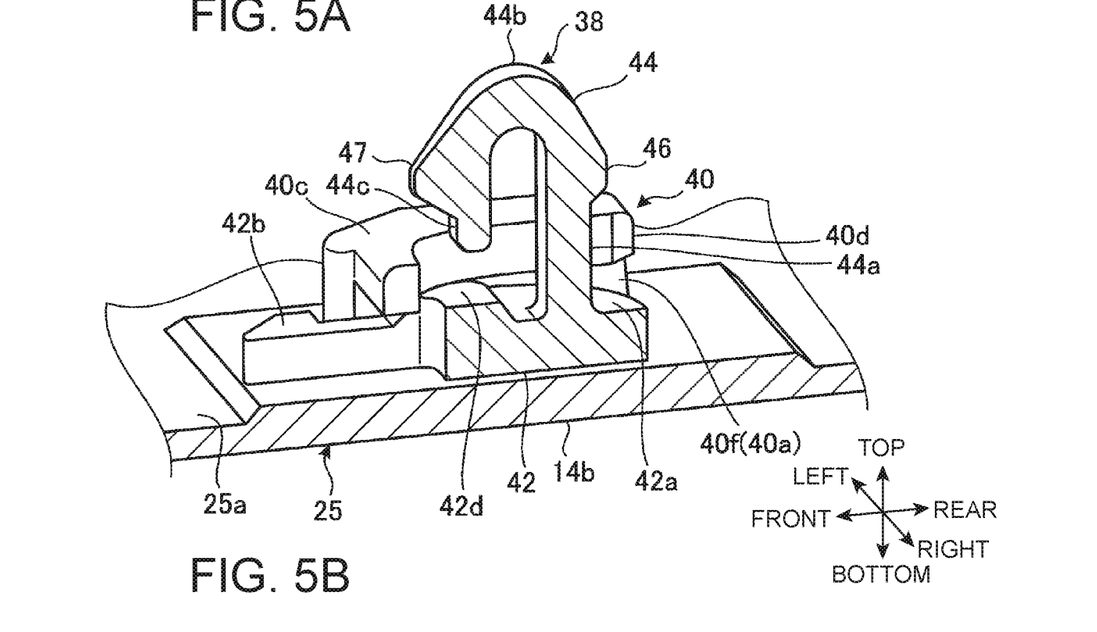
FIG. 5B is a perspective sectional view along the line VB-VB in FIG. 5A.
Figure 6:
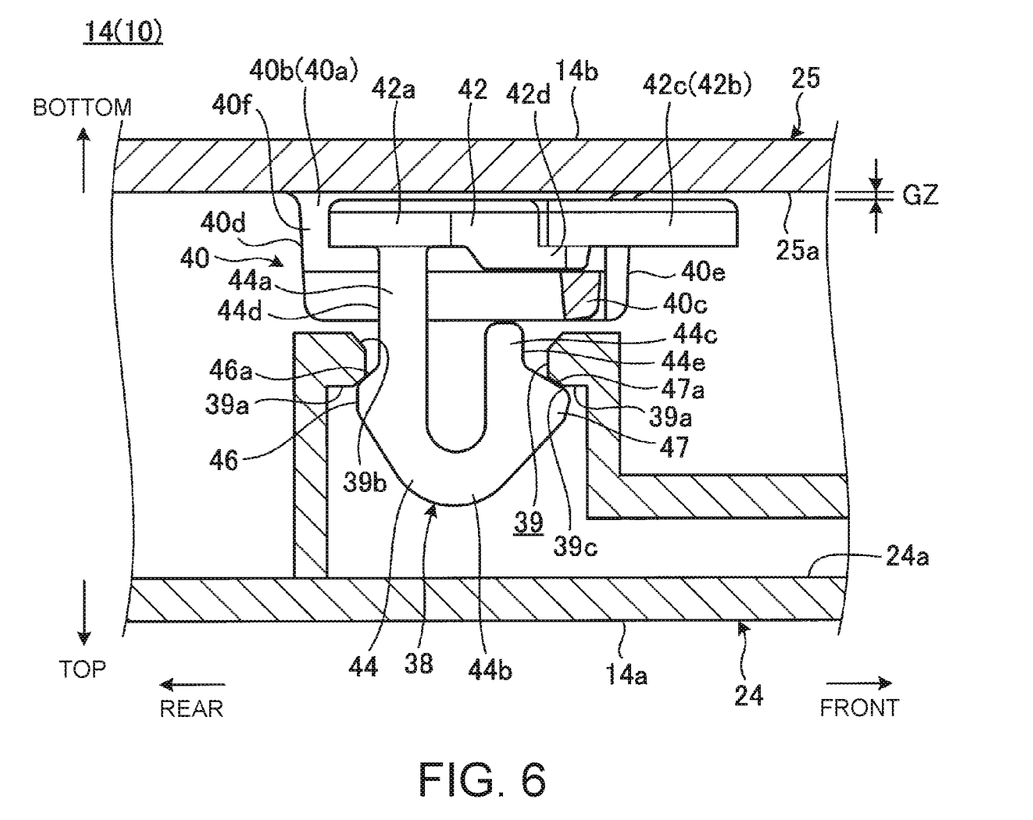
FIG. 6 is a side sectional view illustrating a state in which the hook is engaged with an engagement hole.

Next, a specific configuration example of the connecting unit 32 is described. FIG. 4A is an exploded perspective view illustrating the operation of attaching the hook 38 to the bottom cover 25. FIG. 4B is a perspective view illustrating a state in which the hook 38 is attached to the bottom cover 25 from the state illustrated in FIG. 4A. FIG. 5A is a plan view of the hook 38 illustrated in FIG. 4B. FIG. 5B is a perspective sectional view along the line VB-VB in FIG. 5A. FIG. 6 is a side sectional view schematically illustrating a state in which the hook 38 is engaged with the engagement hole 39, and is a diagram enlarging the hook 38 in the main body chassis 14 and its peripheral part.

As illustrated in FIG. 4A and FIG. 4B, the hook 38 connects the top cover 24 and the bottom cover 25 by being engaged with the engagement hole 39. The hook 38 of the present embodiment is detachably attached to the bottom cover 25 and is supported in a floatable manner with respect to the bottom cover 25. The inner surface 25a of the bottom cover 25 is provided with a floating support unit 40 supporting the hook 38 in a floating state.

As illustrated in FIG. 4A to FIG. 6, the hook 38 has a base part 42 and a hook main body 44. The hook 38 is made of a resin material, for example.

The base part 42 has a disk part 42a and a pair of left and right base lug parts 42b and 42c. The disk part 42a is a thin disk-shaped plate part. In place of the disk part 42a, a rectangular, polygonal, etc. plate part may be used. The hook main body 44 is protrusively provided substantially at a central part of a top surface of the disk part 42a. The base lug parts 42b and 42c are provided side by side to each other and protrude from an outer peripheral surface toward the front. The base lug parts 42b and 42c are symmetrical in shape with each other. Distal ends of the base lug parts 42b and 42c are provided with arrowhead-shaped barbs (hooks) on their side surfaces opposite to the other sides.

As illustrated in FIG. 5B and FIG. 6, the hook main body 44 has a proximal end part 44a, a curved part 44b, and a distal end part 44c, and is substantially J-shaped (hook-shaped) in a side view.

The proximal end part 44a is a bar-like part protruding from the disk part 42a toward the top. The curved part 44b continues from the proximal end part 44a and curves in such a manner as to turn back from the protruding direction of the proximal end part 44a to the opposite direction (toward the bottom). The distal end part 44c is a bar-like part continuing from the curved part 44b and extending downward toward the disk part 42a. That is, the distal end part 44c is provided in parallel to the proximal end part 44a and has an inner side surface facing that of the proximal end part 44a. The distal end part 44c is configured to be shorter in length than the proximal end part 44a and has a tip end located away from the disk part 42a. Accordingly, the hook main body 44 is formed in a J-shape.

The proximal end part 44a has a first lug part 46 protruding from an outer side surface 44d opposite to the distal end part 44c side. The distal end part 44c has a second lug part 47 protruding from an outer side surface 44e opposite to the proximal end part 44a side. Each of the lug parts 46 and 47 is a part serving as a barb (hook) of the hook 38 and is formed in an arrowhead shape. The respective lug parts 46 and 47 are each locked to an edge part 39a in the engagement hole 39. The hook 38 of the present embodiment is that the second lug part 47 is disposed on the side of the connecting unit 31 (the front side) composed of the protruding piece 36 and the insertion hole 37, and the first lug part 46 is disposed on the rear side. In this regard, a locking surface 47a of the second lug part 47 has an amount of engagement with the edge part 39a larger than that of a locking surface 46a of the first lug part 46 facing the rear side. That is, the hook 38 has a structure in which an area in which the locking surface 47a can be locked to the edge part 39a (engagement amount) is larger than an area in which the locking surface 46a can be locked to the edge part 39a (engagement amount).

As illustrated in FIG. 4A to FIG. 5B, the floating support unit 40 is a unit supporting the hook 38 in such a manner that it can move along the inner surface 25a of the bottom cover 25. The floating support unit 40 has a pair of left and right wall parts 40a and 40b, and a top plate part 40c provided on top of the wall parts 40a and 40b. The floating support unit 40 may be configured to be integrally molded with the bottom cover 25 and may be configured as a separate body.

The wall parts 40a and 40b each protrude from the inner surface 25a of the bottom cover 25 and are symmetrical in shape with each other. The wall parts 40a and 40b each extend along the front and rear direction and each front end part bends in a direction coming close to each other. Accordingly, the wall parts 40a and 40b are each formed in a substantially boomerang shape in a planar view. That is, the respective wall parts 40a and 40b are parallel to each other from a rear end part 40d toward a front end part 40e and gradually approach each other near the front end part 40e. Thus, an interval between inner wall surfaces 40f and 40f of the wall parts 40a and 40b at the front end part 40e is narrower than that at the rear end part 40d. The interval between the inner wall surfaces 40f and 40f near the rear end part 40d is wider than the outer diameter of the disk part 42a of the hook 38, and that near the front end part 40e is narrower than the outer diameter of the disk part 42a.

The top plate part 40c is a plate-like part in a substantially U-shape in a planar view and is provided integrally on top of the wall parts 40a and 40b. The top plate part 40c has a groove part 40g whose width is narrower than the interval between the inner wall surfaces 40f and 40f of the wall parts 40a and 40b. The groove part 40g is an opening part having a rear side opened and a front side closed. The right and left width of the groove part 40g is larger than that of the hook main body 44 and is narrower than the outer diameter of the disk part 42a (refer to FIG. 5A). In addition, the interval between the inner surface 25a of the bottom cover 25 and the top plate part 40c in the top and bottom direction is slightly larger than a maximum thickness of the disk part 42a (refer to FIG. 6).

When the hook 38 is attached to the floating support unit 40, the disk part 42a is advanced between the wall parts 40a and 40b from the rear end part 40d side with the base lug parts 42b and 42c in the lead, as illustrated in FIG. 4A and FIG. 4B. When the disk part 42a is pushed between the wall parts 40a and 40b until impingement, the base lug parts 42b and 42c are pressed between the front end parts 40e and 40e to elastically deform. Finally, when the barbs of the base lug parts 42b and 42c ride over the front end parts 40e, the base lug parts 42b and 42c are locked in the floating support unit 40 to be prevented from slipping off. As a result, the hook 38 is disposed at a part in which the disk part 42a is surrounded by the wall parts 40a and 40b and the top plate part 40c, and becomes a state in which the hook main body 44 protrudes through the groove part 40g toward the top.

In this state, as illustrated in FIG. 5A, some gaps GX in the left and right direction are formed between the outer peripheral surface of the disk part 42a and the inner wall surfaces 40f of the wall parts 40a and 40b. In addition, some gap GY in the front and rear direction is also formed between the barbs of the base lug parts 42b and 42c and the inner wall surfaces 40f of the wall parts 40a and 40b. Further, as illustrated in FIG. 6, a slight gap GZ in the top and bottom direction is formed between the disk part 42a and the inner surface 25a or the top plate part 40c. As a result, the hook 38 is supported by the floating support unit 40 in a state movable along the inner surface 25a in the front and rear, and left and right directions. It is to be noted that the gap GZ in the top and bottom direction is a gap for allowing movement in the front and rear direction, movement in the left and right direction, and rotation in a plane parallel to the front and rear direction and the left and right direction, of the disk part 42a supported by the floating support unit 40. That is, an interval between the inner surface 25a and the top plate part 40c is set such that the disk part 42a cannot substantially move in the top and bottom direction. This can prevent the hook 38 from playing in the top and bottom direction, which is the direction connecting the top cover 24 and the bottom cover 25. In addition, the hook 38 can be easily replaced if broken etc., since it is detachable from the bottom cover 25.

As illustrated in FIG. 6, the engagement hole 39 is a circular hole provided on the inner surface 24a side of the top cover 24. The engagement hole 39 is a hole capable of preventing the slipping-off of the hook 38 by locking the inserted lug parts 46 and 47 by the edge part 39a. The engagement hole 39 may be other than circular. However, since the hook 38 of the present embodiment floats, the positions of the lug parts 46 and 47 may be a little moved. Thus, the engagement hole 39 is preferably circular because the hook 38 can be always reliably engaged independently of the positions of the lug parts 46 and 47.

The edge part 39a of the engagement hole 39 has a tapered surface 39b in a chamfered shape at its opening side (opening edge part). The tapered surface 39b is an inclined surface in which the inner diameter of the engagement hole 39 is gradually reduced toward a direction of engaging the hook 38 with the engagement hole 39 (direction from the bottom toward the top). The tapered surface 39b helps the lug parts 46 and 47 smoothly ride over the edge part 39a when the hook 38 is engaged. The edge part 39a of the engagement hole 39 has a chamfered part 39c at its depth side. The chamfered part 39c is to smooth operation of removing the hook 38 from the engagement hole 39. However, the chamfered part 39c is needed to prevent the slipping-off of the hook 38 during normal engagement. Thus, the chamfered part 39c is smaller than the tapered surface 39b and is set to a size such that the lug parts 46 and 47 are not easily disengaged. The chamfered part 39c may be omitted.

Next, operation of mounting the bottom cover 25 to the top cover 24 is described. This mounting operation is usually performed in a state with the main body chassis 14 upside down.

First, as illustrated in FIG. 3B, the bottom cover 25 is held in an inclined posture with its front end part inclined to the top cover 24 side, and each protruding piece 36 is inserted into each insertion hole 37. Subsequently, the rear end part of the bottom cover 25 is brought close toward the top cover 24 side as indicated by a dashed arrow in FIG. 3B. Then, as illustrated in FIG. 3A, the hook 38 engages with the engagement hole 39 and the fastening hole for each screw 34 formed in the bottom cover 25 coincides with each boss part 35 until the bottom cover 25 entirely abuts on the top cover 24. Then, each screw 34 is threadably mounted on each boss part 35. Accordingly, the operation of mounting the bottom cover 25 to the top cover 24 is completed and the bottom cover 25 is connected to the top cover 24 through the connecting units 30 to 32.

During this mounting operation, the hook 38 may be disposed deviated a little from the center of the engagement hole 39 due to manufacturing tolerance or manufacturing error, or assembly error of the bottom cover 25 and the top cover 24, for example. Even in this case, the hook 38 of the present embodiment is moved through the floating support unit 40 and automatically centered with respect to the engagement hole 39. In particular, the edge part 39a of the engagement hole 39 of the present embodiment has the tapered surface 39b at the opening edge part on the side for receiving the hook 38. Thus, the hook 38 is more smoothly centered to be guided into the engagement hole 39 since each of the lug parts 46 and 47 slides on the tapered surface 39b. As a result, since the lug parts 46 and 47 smoothly ride over the edge part 39a while the distal end part 44c is elastically deformed through the curved part 44b, the hook 38 is smoothly engaged with the engagement hole 39 (refer to FIG. 6). It is to be noted that the hook 38 may have a shape other than the above-described shape, such as a conventionally commonly used one. That is, if the hook 38 has another shape, a smooth engagement action etc. with respect to the engagement hole 39 is secured by the floating operation of the floating support unit 40.

In the meanwhile, the hook 38 is that the locking surfaces 46a and 47a of the lug parts 46 and 47 have different sizes. However, the hook 38 is set again to the center of the engagement hole 39 immediately after engaging with the engagement hole 39, by the centering function of the floating support unit 40. As a result, in a state in which the hook 38 engages with the engagement hole 39, the lug parts 46 and 47 each become a state in which their locking surfaces 46a and 47a are reliably locked to the edge part 39a of the engagement hole 39. Thus, even if external force to the bottom is applied to the bottom cover 25 in the state illustrated in FIG. 6, it is possible to prevent the hook 38 from slipping off from the engagement hole 39. Furthermore, the hook 38 has a cantilever structure with one bar-like member folded and has a structure having a protrusion length from the proximal end (root) to the distal end as long as possible. Thus, for example, even if large impact due to falling of the main body chassis 14 etc. is made, stress received by the hook 38 is distributed and thus breakage due to local concentration of the stress is prevented.

In addition, the hook 38 of the present embodiment has a bulging part 42d at a part of the top surface of the disk part 42a, as illustrated in FIG. 5B and FIG. 6. The bulging part 42d is a trapezoidal part in which a front end part of the top surface of the disk part 42a is protruded toward the top, and the plate thickness of the disk part 42a is made partially thicker. The hook 38 is provided on a lower part of the disk part 42a other than the bulging part 42d. Accordingly, the hook 38 can secure the protrusion length of the hook main body 44 to be as long as possible. In addition, the hook 38 can be easily inserted into and removed from the floating support unit 40 since most of the disk part 42a is thinner than the bulging part 42d. Furthermore, in the floating support unit 40, the height dimension between the inner surface 25a and the top plate part 40c can be configured to be relatively large since it only needs to support the top surface of the bulging part 42d. Thus, the floating support unit 40 can also be more easily molded with respect to the bottom cover 25 made of metal.

It is to be noted that in the electronic apparatus chassis 10, the floating support unit 40 may be omitted. In this case, the hook 38 is structured to be fixed to the bottom cover 25. However, the hook 38 of the present embodiment has a J-shape including the proximal end part 44a, the curved part 44b, and the distal end part 44c, as illustrated in FIG. 6, and in particular, the distal end part 44c elastically deforms. Thus, smooth engagement with the engagement hole 39 is possible. Furthermore, the hook 38 has high strength due to the above-described J-shape. Thus, even if the hook 38 is subjected to a large load due to positional deviation when engaged with the engagement hole 39, it is not easily broken and can be smoothly guided into the engagement hole 39.

Figure 7A:
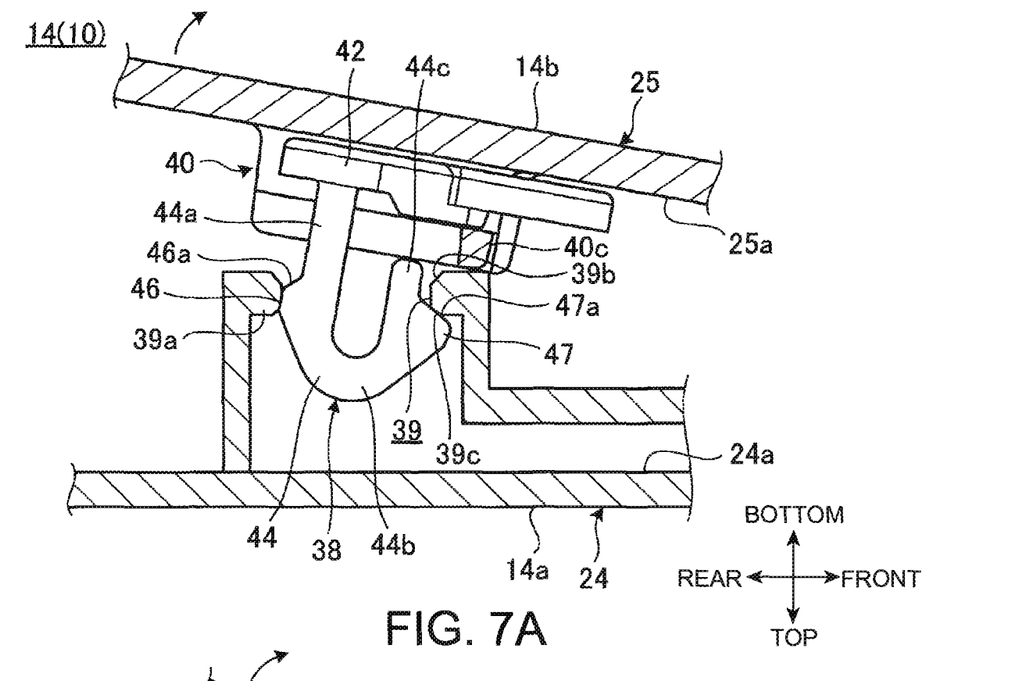
FIG. 7A is a side sectional view illustrating a state in which the hook is lifted from the state illustrated in FIG. 6, and a first lug part rides over an edge part of the engagement hole.
Figure 7B:
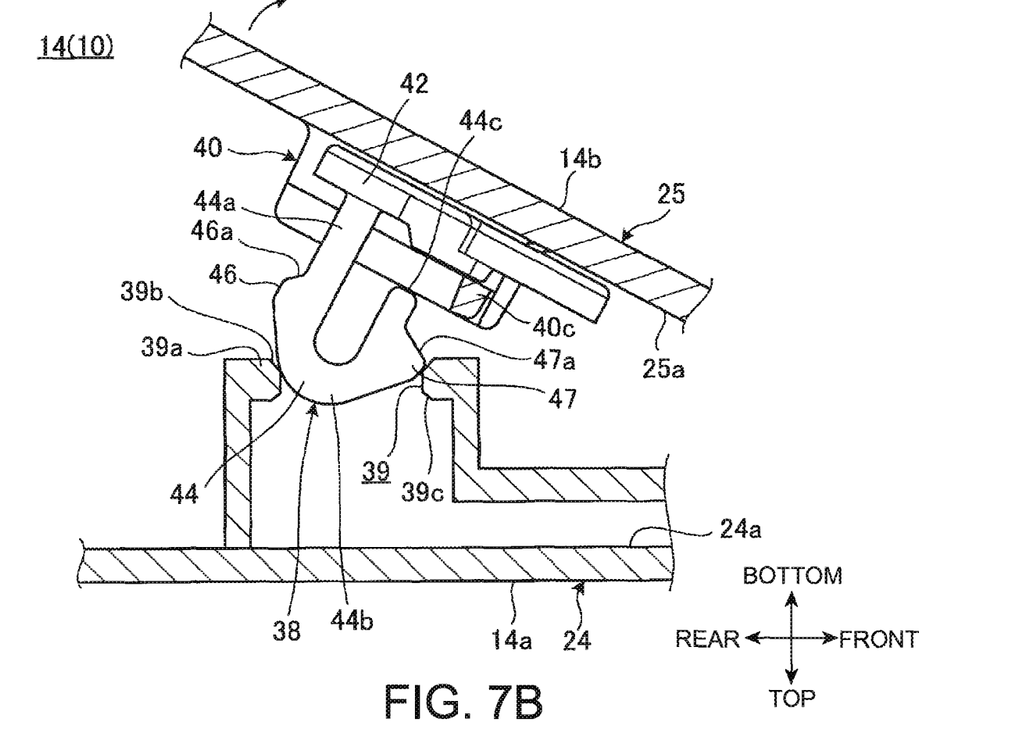
FIG. 7B is a side sectional view illustrating a state in which the hook is further lifted from the state illustrated in FIG. 7A and a second lug part also rides over the edge part of the engagement hole.

Next, operation of detaching the bottom cover 25 from the top cover 24 is described. FIG. 7A is a side sectional view illustrating a state in which the hook 38 is lifted from the state illustrated in FIG. 6 and the first lug part 46 rides over the edge part 39a of the engagement hole 39. FIG. 7B is a side sectional view illustrating a state in which the hook 38 is further lifted from the state illustrated in FIG. 7A and the second lug part 47 also rides over the edge part 39a of the engagement hole 39. This detaching operation is also usually performed in a state with the main body chassis 14 upside down.

First, all the screws 34 are removed to release the connecting state of the connecting units 30. Then, as indicated by a solid arrow in FIG. 3B, the rear end part of the bottom cover 25 is lifted making the connecting unit 31 connecting each protruding piece 36 and each insertion hole 37 at the front edge part 14f a center of rotation. Accordingly, the hook 38 is removed from the engagement hole 39 and the engaging state of the connecting unit 32 is released. Then, each protruding piece 36 is removed from each insertion hole 37 by lifting the bottom cover 25 while drawing it toward the rear. Accordingly, the connecting state of all the connecting units 30 to 32 is released and the operation of detaching the bottom cover 25 from the top cover 24 is completed.

During this detaching operation, the hook 38 is inclined toward the second lug part 47 at the front side as illustrated in FIG. 7A, in the rotating operation of lifting the rear end part of the bottom cover 25 from the top cover 24. That is, the hook 38 receives external force in a direction for the first lug part 46 at the rear side to push the edge part 39a at the rear side in a state in which the second lug part 47 at the front side abuts on the edge part 39a at the front side of the engagement hole 39. Thus, the hook 38 is that the first lug part 46 first rides over the edge part 39a while the curved part 44b and the distal end part 44c elastically deform (refer to FIG. 7A). The hook 38 further receives the above-described external force, and this time the second lug part 47 also rides over the edge part 39a (refer to FIG. 7B). As a result, the engaging state of the hook 38 and the engagement hole 39 is released and the connecting state of the connecting unit 32 is released.

In the meanwhile, the hook 38 has the second lug part 47 disposed at the side of the protruding piece 36 serving as a rotation supporting point during the detaching operation of the bottom cover 25, the second lug part 47 having the second locking surface 47a having a larger amount of engagement than that of the first locking surface 46a of the first lug part 46. Thus, when the rear end part of the bottom cover 25 is lifted, the first lug part 46 can be more smoothly and with light force removed from the engagement hole 39. When the second lug part 47 is removed from the engagement hole 39, even the second lug part 47 having a large amount of engagement can be easily removed since the first lug part 46 has been already removed. It is to be noted that if the connecting unit 31 is provided other than in the front edge part 14f, the hook 38 may have the second lug part 47 disposed at the side of this connecting unit 31.

As described above, the electronic apparatus chassis 10 of the present embodiment includes the hook 38 provided in such a manner as to protrude from the inner surface 25a side of the bottom cover 25 and supported in a floatable manner with respect to the bottom cover 25, and the engagement hole 39 provided on the inner surface 24a side of the top cover 24 and engageable with the hook 38. The electronic apparatus chassis 10 is therefore that when the top cover 24 and the bottom cover 25 are connected, the hook 38 is smoothly engaged with the engagement hole 39 while being centered with respect to the engagement hole 39 by floating operation. Thus, the electronic apparatus chassis 10 is that even if the hook 38 or the engagement hole 39 is positionally deviated from a desired design position due to influence of manufacturing tolerance or manufacturing error, or assembly error of the bottom cover 25 and the top cover 24, for example, both can be smoothly engaged. Thus, the connecting unit 32 with the hook 38 and the engagement hole 39 contributes to smooth connecting operation of the top cover 24 and the bottom cover 25 even if it is disposed not only in the central part of the electronic apparatus chassis 10 but also in various positions including the outer peripheral edge part etc.

In addition, the electronic apparatus chassis 10 of the present embodiment includes the hook 38 protruding from the inner surface 25a side of the bottom cover 25, and the engagement hole 39 provided on the inner surface 24a side of the top cover 24 and engageable with the hook 38. Then, the hook 38 is configured to have the proximal end part 44a, the curved part 44b, the distal end part 44c, the first lug part 46, and the second lug part 47. Thus, the hook 38 can smoothly elastically deform when inclined toward the engagement hole 39 and secures high strength by maximizing its protrusion length. The electronic apparatus chassis 10 is therefore that even if the hook 38 is integrally fixed to the bottom cover 25, the hook 38 and the engagement hole 39 can be smoothly engaged by using the above-configured hook 38.

In particular, in the electronic apparatus chassis 10, the connecting unit 32 with the hook 38 and the engagement hole 39 is provided near the central part of the chassis. Thus, the electronic apparatus chassis 10 is that the connection of the connecting unit 32 can be smoothly performed even near the central part of the chassis where influence of accumulation etc. of manufacturing tolerance appears more easily than the outer peripheral edge part. Furthermore, the top cover 24 and the bottom cover 25 are connected near the central part of the chassis. This can prevent the bottom cover 25 from swelling toward the bottom and also prevent occurrence of failure, such as tucking a foreign object into between an electronic component, including a battery device 28 etc., and the bottom cover 25.

In addition, it is a matter of course that the present invention is not limited to the embodiments described above and can be freely altered without deviating from the scope of the present invention.

In the above, the configuration in which the top cover 24 is provided with the engagement hole 39 and the bottom cover 25 is provided with the hook 38, is illustrated by an example. However, the top cover 24 may be provided with the hook 38 and the bottom cover 25 may be provided with the engagement hole 39. However, if the hook 38 is provided on the bottom cover 25 side, there is the advantage that the hook 38 is easily removed from the engagement hole 39 while appropriately moving the bottom cover 25 in the detaching operation of the bottom cover 25. In addition, in the electronic apparatus chassis 10 used for the main body chassis 14 of a laptop PC, for example, a user usually detaches the bottom cover 25 from the top cover 24 mounted with the keyboard device 22 and the board 27 etc. to perform maintenance etc. Thus, if the hook 38 is provided on the bottom cover 25 side, replacement in breakage etc. is also easily performed.

In the above, the configuration in which the electronic apparatus chassis 10 is used for the electronic apparatus 12 of a laptop PC, is illustrated by an example. If the electronic apparatus chassis 10 is used for, for example, a tablet PC or a smart phone, other than the laptop PC, the engagement hole 39 and the hook 38 may be provided on the top cover 24 provided with a display and the bottom cover 25 covering its back side.

As has been described, the present invention provides an improved electronic apparatus having a first and second chassis members.

While the invention has been particularly shown and described with reference to a preferred embodiment, it will be understood by those skilled in the art that various changes in form and detail may be made therein without departing from the spirit and scope of the invention.

What is claimed is:

1. An electronic apparatus comprising:
    a display chassis;
    a main body chassis, rotatably connected to said display chassis, includes
        a first chassis member having a floating support unit for supporting a base part in a floating state, wherein said base part is detachably mounted to said floating support unit;
        a second chassis member detachably connected to said first chassis member;
        a hook, which is supported in a floatable manner with respect to said first chassis member, protrudes from an inner surface of said first chassis member, wherein said hook includes a hook main body protruding from said base part; and
        an engagement hole, which is provided on an inner surface of said second chassis member, is engageable with said hook main body.

2. The electronic apparatus of claim 1, wherein said hook main body is in a J-shape.

3. The electronic apparatus of claim 2, wherein said main body chassis includes a keyboard.

4. The electronic apparatus of claim 3, wherein said display chassis includes a display.

5. The electronic apparatus of claim 1, wherein said hook main body includes:
    a proximal end part protruding from said base part;
    a curved part continuing from said proximal end part and curving in such a manner as to turn back from a protruding direction of said proximal end part to an opposite direction;
    a distal end part continuing from said curved part and having an inner side surface facing that of said proximal end part by extending in a direction opposite to said protruding direction of said proximal end part;
    a first lug part protruding from an outer side surface of said proximal end part and to be locked to an edge part of said engagement hole; and
    a second lug part protruding from an outer side surface of said distal end part and to be locked to said edge part of said engagement hole.

6. The electronic apparatus of claim 1, wherein said floating support unit supports said hook in a state movable along said inner surface of said first chassis member.

7. The electronic apparatus of claim 6, wherein said floating support unit includes a top plate part holding a plate part provided on said base part in a state movable between said top plate part and said inner surface of said first chassis member.

8. The electronic apparatus of claim 7, wherein an interval between said inner surface of said first chassis member and said top plate part is set to an interval for holding said plate part in a state substantially unmovable in a direction from said inner surface towards said top plate part.

9. The electronic apparatus of claim 1, wherein an opening edge part of said engagement hole is provided with a tapered surface whose inner diameter gradually decreases towards an engaging direction of said hook.

10. An electronic apparatus comprising:
    a first chassis member;
    a second chassis member detachably connected to said first chassis member;
    a hook protruding from an inner surface of said first chassis member; and
    an engagement hole, which is provided on an inner surface of said second chassis member, is engageable with said hook, wherein said hook includes:
        a proximal end part protruding from said inner surface of said first chassis member;
        a curved part continuing from said proximal end part and curving in such a manner as to turn back from a protruding direction of said proximal end part to an opposite direction;
        a distal end part continuing from said curved part and having an inner side surface facing that of said proximal end part by extending in a direction opposite to said protruding direction of said proximal end part;
        a first lug part protruding from an outer side surface of said proximal end part and to be locked to an edge part of said engagement hole; and
        a second lug part protruding from an outer side surface of said distal end part and to be locked to said edge part of said engagement hole.

11. The electronic apparatus of claim 10, wherein said first lug part includes a first locking surface to be locked to said edge part of said engagement hole.

12. The electronic apparatus of claim 11, wherein said second lug part includes a second locking surface to be locked to said edge part of said engagement hole.

13. The electronic apparatus of claim 12, wherein said second locking surface includes a larger amount of engagement with said engagement hole than that of said first locking surface.

14. The electronic apparatus of claim 10, wherein said first chassis member and said second chassis member are rectangular in shape.

15. The electronic apparatus of claim 14, wherein said first lug part is disposed at one edge part side of said first chassis member and said second chassis member.

16. The electronic apparatus of claim 15, wherein said second lug part is disposed at said other edge part side of said first chassis member and said second chassis member, said other edge part side being opposite to said one edge part side.

17. The electronic apparatus chassis of claim 10, wherein said first chassis member and said second chassis member are connected to each other by a plurality of connecting parts including a connecting part with said hook and said engagement hole.

18. The electronic apparatus chassis of claim 17, wherein a connecting unit provided at least at said one edge part has a protruding piece provided in one of said first chassis member and said second chassis member and an insertion hole which is provided in said other of said first chassis member and said second chassis member and into which said protruding piece is inserted in a direction from said other edge part toward said one edge part.

19. The electronic apparatus chassis of claim 18, wherein said connecting unit having said hook and said engagement hole is provided at a part other than said one edge part.

* * * * *